US008415232B2

United States Patent
Kajiyama et al.

(10) Patent No.: US 8,415,232 B2
(45) Date of Patent: Apr. 9, 2013

(54) DIVIDING METHOD FOR WAFER HAVING DIE BONDING FILM ATTACHED TO THE BACK SIDE THEREOF

(75) Inventors: Keiichi Kajiyama, Ota-Ku (JP); Takatoshi Masuda, Ota-ku (JP)

(73) Assignee: Disco Corporation, Tokyo (JP)

( * ) Notice: Subject to any disclaimer, the term of this patent is extended or adjusted under 35 U.S.C. 154(b) by 34 days.

(21) Appl. No.: 13/277,874

(22) Filed: Oct. 20, 2011

(65) Prior Publication Data

US 2012/0100694 A1 Apr. 26, 2012

(30) Foreign Application Priority Data

Oct. 21, 2010 (JP) .................................. 2010-236336

(51) Int. Cl.
*H01L 21/301* (2006.01)
*H01L 21/46* (2006.01)
*H01L 21/78* (2006.01)

(52) U.S. Cl. ................ 438/460; 438/463; 257/E21.237; 257/E21.244; 257/E21.596

(58) Field of Classification Search .................. 438/459, 438/460, 462, 463, 464; 257/E21.237, E21.244, 257/E21.596
See application file for complete search history.

(56) References Cited

U.S. PATENT DOCUMENTS

2007/0004177 A1* 1/2007 Nakamura et al. ............ 438/460

FOREIGN PATENT DOCUMENTS

| JP | 11-040520 | 2/1999 |
| JP | 2002-118081 | 4/2002 |
| JP | 2002-192370 | 7/2002 |
| JP | 2005-223285 | 8/2005 |

* cited by examiner

*Primary Examiner* — Hoai V Pham
(74) *Attorney, Agent, or Firm* — Greer, Burns & Crain, Ltd.

(57) ABSTRACT

A wafer is divided into individual devices along division lines formed on the front side of the wafer. The devices are respectively formed in a plurality of regions partitioned by the division lines. A protective member is provided on the front of the wafer, and the back of the wafer is ground to a predetermined thickness. A laser beam is applied to the wafer from the back side of the wafer along the division lines with the focal point of the laser beam set inside the wafer at a position corresponding to each division line, thereby forming a plurality of modified layers inside the wafer along the division lines. The wafer is divided along the modified layers into the individual devices, and the back side of the wafer is ground to remove the modified layers and reduce the thickness of each device to the finished thickness.

3 Claims, 10 Drawing Sheets

DIVIDING METHOD FOR WAFER HAVING DIE BONDING FILM ATTACHED TO THE BACK SIDE THEREOF

BACKGROUND OF THE INVENTION

1. Field of the Invention

The present invention relates to a wafer dividing method for dividing a semiconductor wafer into a plurality of individual devices, wherein a die bonding film such as a die attach film (DAF) is attached to the back side of the semiconductor wafer.

2. Description of the Related Art

A plurality of devices such as ICs and LSIs are formed on the front side of a semiconductor wafer so as to be partitioned by a plurality of division lines. After grinding the back side of the semiconductor wafer to reduce the thickness of the wafer to a predetermined thickness, the wafer is divided into the individual devices by using a dicing apparatus (cutting apparatus). The devices thus obtained are widely used in electric equipment such as mobile phones and personal computers. In recent years, it has been desired to further reduce the weight and size of electric equipment such as mobile phones and personal computers, so that thinner devices have been required. As a technique of dividing a wafer into thinner devices, a so-called dicing before grinding process has been developed and put to practical use (see Japanese Patent Laid-open No. Hei 11-40520, for example).

This dicing before grinding process includes the steps of forming a dividing groove having a predetermined depth (corresponding to the finished thickness of each device) along each division line on the front side of a semiconductor wafer and next grinding the back side of the semiconductor wafer to expose each dividing groove to the back side of the semiconductor wafer, thereby dividing the semiconductor wafer into the individual devices. By this dicing before grinding process, the thickness of each device can be reduced to 50 µm or less. However, in the case of providing a die attach film (DAF) as a die bonding film on the back side of the wafer divided into the individual devices by the dicing before grinding process, it is relatively difficult to divide the DAF along the boundaries of the individual devices, resulting in low productivity (see Japanese Patent Laid-open No. 2002-118081, for example).

Further, a technique called stealth dicing has been proposed and put to practical use (see Japanese Patent No. 3408805, for example). The stealth dicing includes the steps of applying a laser beam having a transmission wavelength to the wafer along the division lines in the condition where the focal point of the laser beam is set inside the wafer at a position corresponding to each division line to thereby form a plurality of modified layers inside the wafer along the division lines and next applying an external force to the modified layers to thereby divide the wafer into the individual devices. According to this technique, the spacing between any adjacent ones of the individual devices obtained by dividing the wafer is very small. Accordingly, in the case that a DAF is provided on the back side of the wafer divided into the individual devices, and the wafer is attached through the DAF to a dicing tape, the DAF can be easily divided by expanding the dicing tape in the radial direction (see Japanese Patent Laid-open No. 2005-223285, for example).

SUMMARY OF THE INVENTION

However, in such a technique of manufacturing devices with DAFs by forming the modified layers inside the wafer, attaching the back side of the wafer through the DAF to the dicing tape, and expanding the dicing tape in the radial direction, there is a problem such that the die strength of each device is reduced by the modified layers remaining on the outer circumference of each device.

It is therefore an object of the present invention to provide a wafer dividing method which can easily divide the DAF along the boundaries of the individual devices without a reduction in die strength of each device.

In accordance with an aspect of the present invention, there is provided a wafer dividing method for dividing a wafer into a plurality of individual devices along a plurality of division lines formed on the front side of the wafer, wherein the devices are respectively formed in a plurality of regions partitioned by the division lines, the wafer dividing method including a protective member providing step of providing a protective member on the front side of the wafer; a back grinding step of grinding the back side of the wafer to reduce the thickness of the wafer to a predetermined thickness; a modified layer forming step of applying a laser beam having a transmission wavelength to the wafer from the back side of the wafer along the division lines in the condition where the focal point of the laser beam is set inside the wafer at a position corresponding to each division line, thereby forming a plurality of modified layers inside the wafer along the division lines at such a depth not reaching a finished thickness of each device; a wafer dividing step of dividing the wafer along the modified layers into the individual devices; a modified layer removing step of grinding the back side of the wafer divided into the individual devices to thereby remove the modified layers and reduce the thickness of each device to the finished thickness; a frame providing step of preparing an annular frame having a circular opening, attaching a dicing tape at its outer circumferential portion to the annular frame so as to close the circular opening, attaching a die bonding film to the dicing tape in the circular opening of the annular frame, and attaching the back side of the wafer to the die bonding film; a protective member removing step of removing the protective member from the front side of the wafer; and a die bonding film dividing step of expanding the dicing tape to increase the spacing between any adjacent ones of the individual devices, thereby dividing the die bonding film along the boundaries of the individual devices.

Preferably, a film is formed on the division lines of the wafer; the wafer dividing method of the present invention further including a film cutting step of applying a laser beam for ablation to the film along the division lines, thereby cutting the film along the division lines before performing the back grinding step. The film includes any one of a metal film including a TEG, an insulating film including a Low-k film, and a resin film including a polyimide film.

According to the present invention, stealth dicing is performed to divide the wafer into the individual devices. Thereafter, the back side of the wafer is ground to remove the modified layers. Thereafter, the dicing tape is attached through the die bonding film to the back side of the wafer. Thereafter, the dicing tape is expanded in the radial direction to thereby divide the die bonding film along the boundaries of the individual devices. Accordingly, the die bonding film can be easily divided along the boundaries of the individual devices without a reduction in die strength of each device. Further, the thin devices can be provided.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 11 is a perspective view showing a film cutting step.

DETAILED DESCRIPTION OF THE PREFERRED EMBODIMENTS

Figure 1:
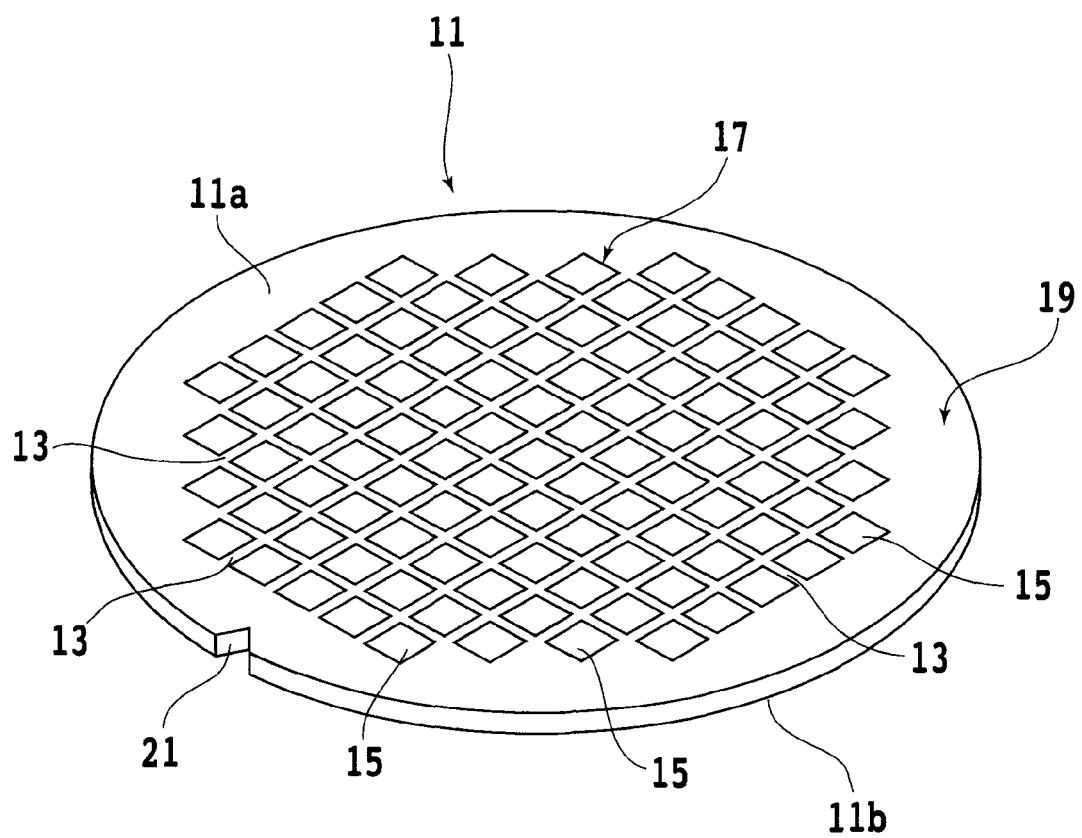
FIG. 1 is a perspective view showing the front side of a semiconductor wafer.

A preferred embodiment of the present invention will now be described in detail with reference to the drawings. FIG. 1 is a perspective view of a semiconductor wafer 11 to be processed to reach a predetermined thickness. For example, the semiconductor wafer 11 shown in FIG. 1 is a silicon wafer having a thickness of 700 μm. A plurality of crossing streets (division lines) 13 are formed on the front side 11a of the semiconductor wafer 11, thereby partitioning a plurality of rectangular regions in which a plurality of devices 15 such as ICs and LSIs are respectively formed.

Figure 2:
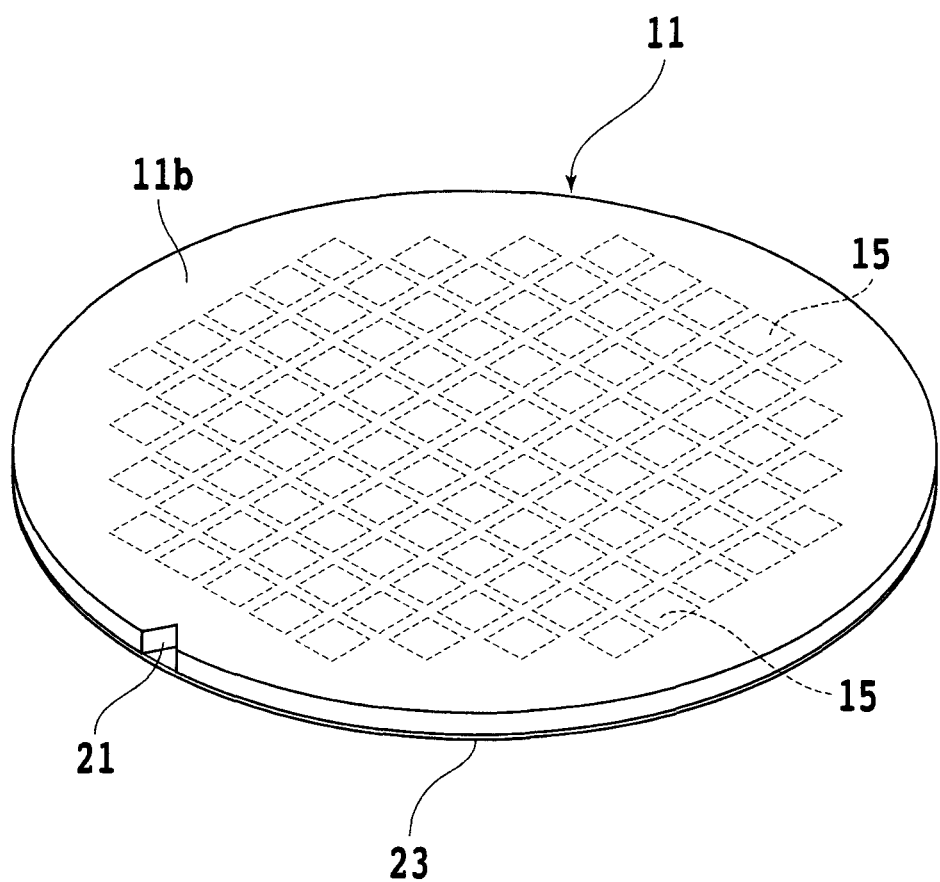
FIG. 2 is a perspective view showing the back side of the semiconductor wafer in the condition where a protective tape is attached to the front side of the wafer.

The semiconductor wafer 11 configured as above has a device area 17 where the devices 15 are formed and a peripheral marginal area 19 surrounding the device area 17. Further, the outer circumference of the semiconductor wafer 11 is formed with a notch 21 as a mark for indicating the crystal orientation of the silicon wafer. As shown in FIG. 2, a protective tape 23 for protecting the devices 15 is attached to the front side 11a of the semiconductor wafer 11 in a protective tape attaching step. Accordingly, the front side 11a of the semiconductor wafer 11 is entirely covered with the protective tape 23, and the back side 11b of the semiconductor wafer 11 is exposed as shown in FIG. 2.

After performing the protective tape attaching step, a back grinding step is performed in such a manner that the back side 11b of the semiconductor wafer 11 is ground to reduce the thickness of the wafer 11 to a predetermined thickness. This back grinding step is performed by using a grinding apparatus shown in FIG. 3. The grinding apparatus shown in FIG. 3 includes a chuck table 10 for holding the wafer 11 and a grinding unit 12 for grinding the back side 11b of the wafer 11 held on the chuck table 10. The wafer 11 is held on the chuck table 10 under suction in the condition where the protective tape 23 attached to the front side 11a of the wafer 11 is oriented downward, i.e., the back side 11b of the wafer 11 is oriented upward. The grinding unit 12 includes a spindle 14 adapted to be rotationally driven by a motor, a wheel mount 16 fixed to the lower end of the spindle 14, and a grinding wheel 18 detachably mounted on the lower surface of the wheel mount 16 by screws 25. The grinding wheel 18 is composed of an annular base 20 and a plurality of abrasive members 22 fixed to the lower surface of the annular base 20.

Figure 3:
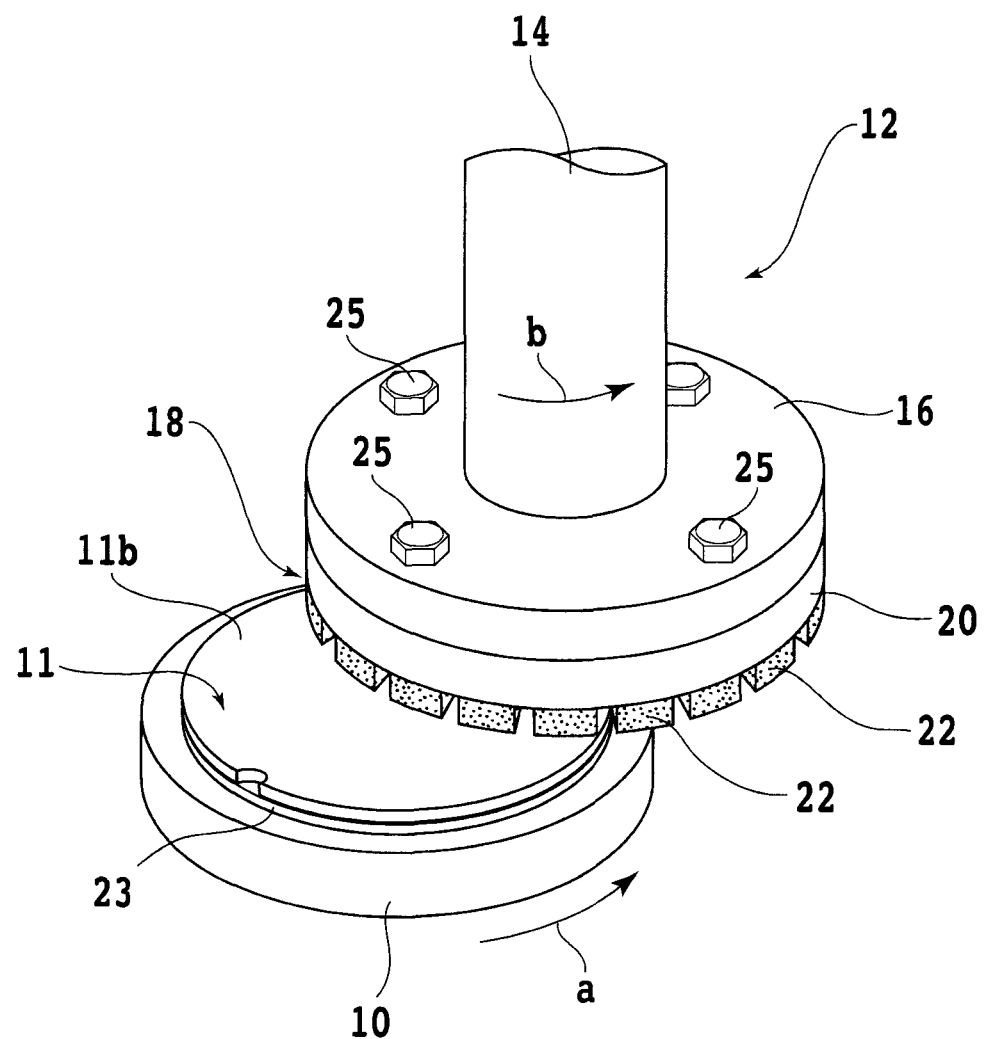
FIG. 3 is a perspective view showing a back grinding step.

In the back grinding step, the chuck table 10 is rotated in the direction shown by an arrow a in FIG. 3 at 300 rpm, for example, and the grinding wheel 18 is rotated in the same direction as the direction of rotation of the chuck table 10, i.e., in the direction shown by an arrow b in FIG. 3 at 6000 rpm, for example. Then, a grinding unit feeding mechanism (not shown) is operated to bring the abrasive members 22 into contact with the back side 11b of the wafer 11. The grinding wheel 18 is further fed downward by a predetermined amount at a predetermined feed speed (e.g., 3 to 5 μm/s) to thereby grind the back side 11b of the wafer 11. In grinding the back side 11b of the wafer 11, a contact type or noncontact type thickness gauge is used to measure the thickness of the wafer 11, thereby reaching a desired thickness (e.g., 100 μm) of the wafer 11.

Figure 4:
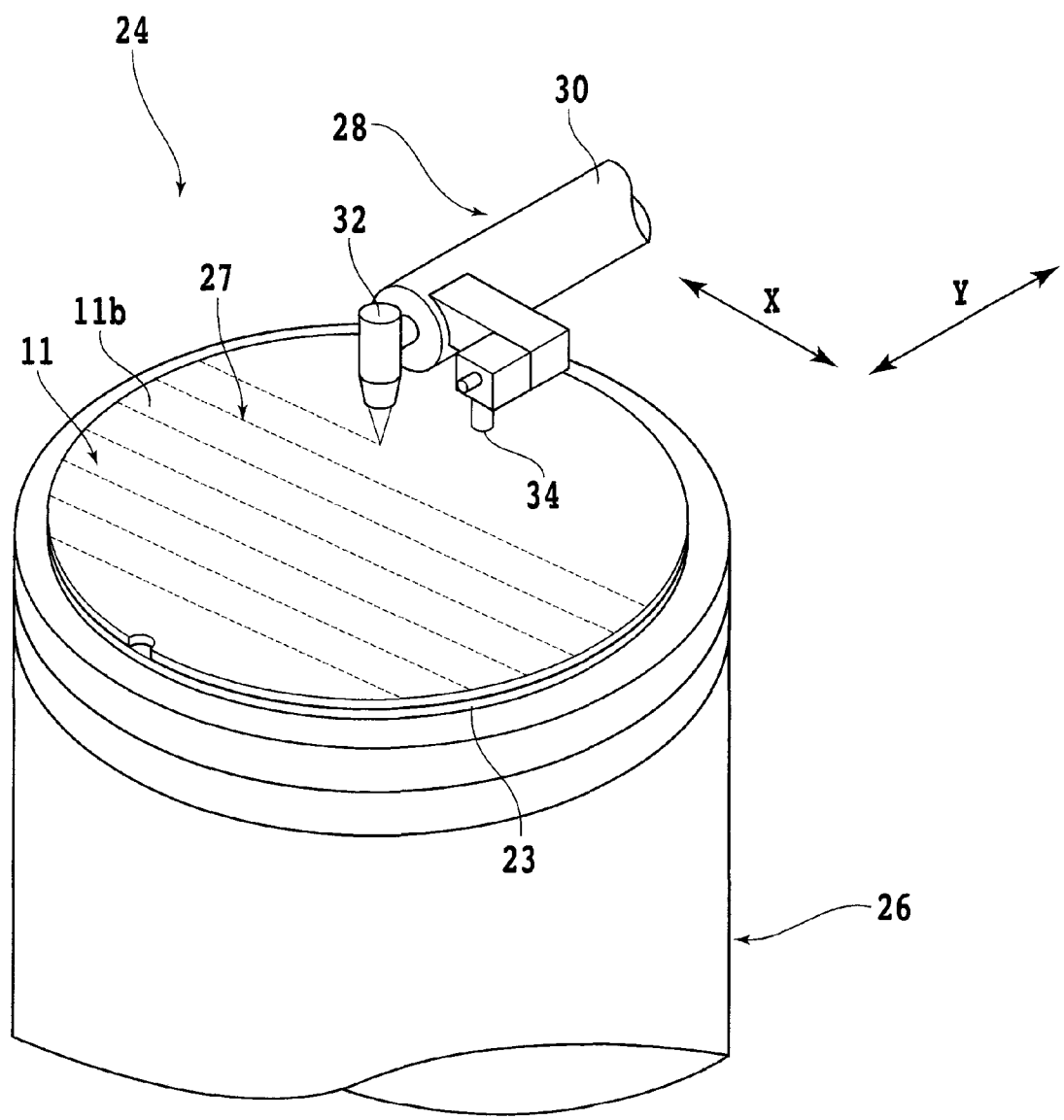
FIG. 4 is a perspective view showing a modified layer forming step.
Figure 5:
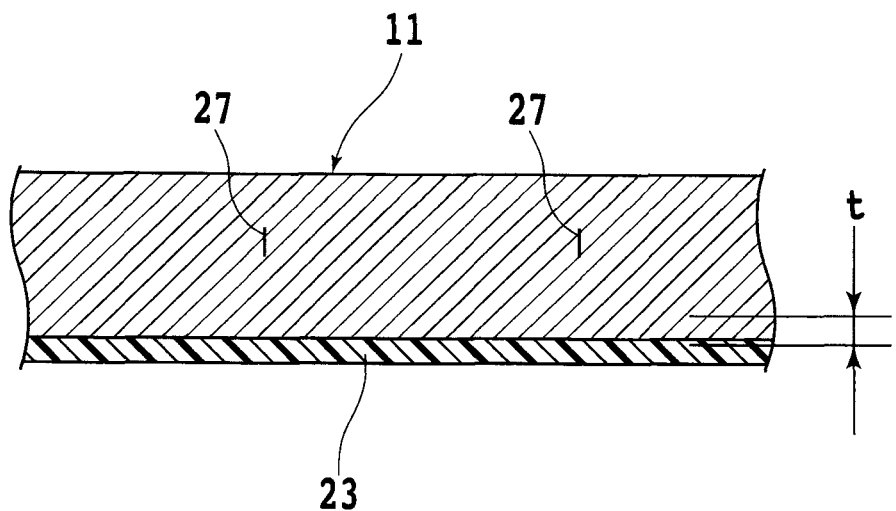
FIG. 5 is a sectional view of the semiconductor wafer in the condition where modified layers are formed inside the wafer.

After performing the back grinding step, a modified layer forming step is performed by using a laser processing apparatus 24 shown in FIG. 4. The laser processing apparatus 24 shown in FIG. 4 includes a chuck table 26 for holding the wafer 11 and a laser beam applying unit 28 for applying a laser beam to the wafer 11 held on the chuck table 26. The wafer 11 processed by the back grinding step is held on the chuck table 26 under suction in the condition where the protective tape 23 attached to the front side 11a of the wafer 11 is oriented downward, i.e., the back side 11b of the wafer 11 is oriented upward. The laser beam applying unit 28 includes a housing 30 containing a laser oscillator and repetition frequency setting means well known in the art. The laser beam applying unit 28 further includes focusing means (laser head) 32 for focusing a laser beam oscillated from the laser oscillator. The laser beam having a transmission wavelength to the wafer 11 is applied from the focusing means 32 to the wafer 11 in the condition where the focal point of the laser beam is set inside the wafer 11 at a position corresponding to each division line 13. As a result, a plurality of modified layers 27 are formed inside the wafer 11 along the division lines 13 at such a depth not reaching a finished thickness of each device 15 as shown in FIG. 5. For example, each modified layer 27 is formed at a depth of about 50 μm from the back side 11b of the wafer 11. In FIG. 5, t denotes the finished thickness of each device 15, and it is set to 20 to 30 μm, for example.

For example, the modified layer forming step is performed under the following processing conditions.

Light source: LD pumped Q-switched Nd:YVO4 pulsed laser
Wavelength: 1064 nm
Repetition frequency: 100 kHz
Pulse width: 40 ns
Average power: 1 W
Focused spot diameter: 1 μm
Work feed speed: 100 mm/s
Incident surface: ground surface (back side)

Figure 6:
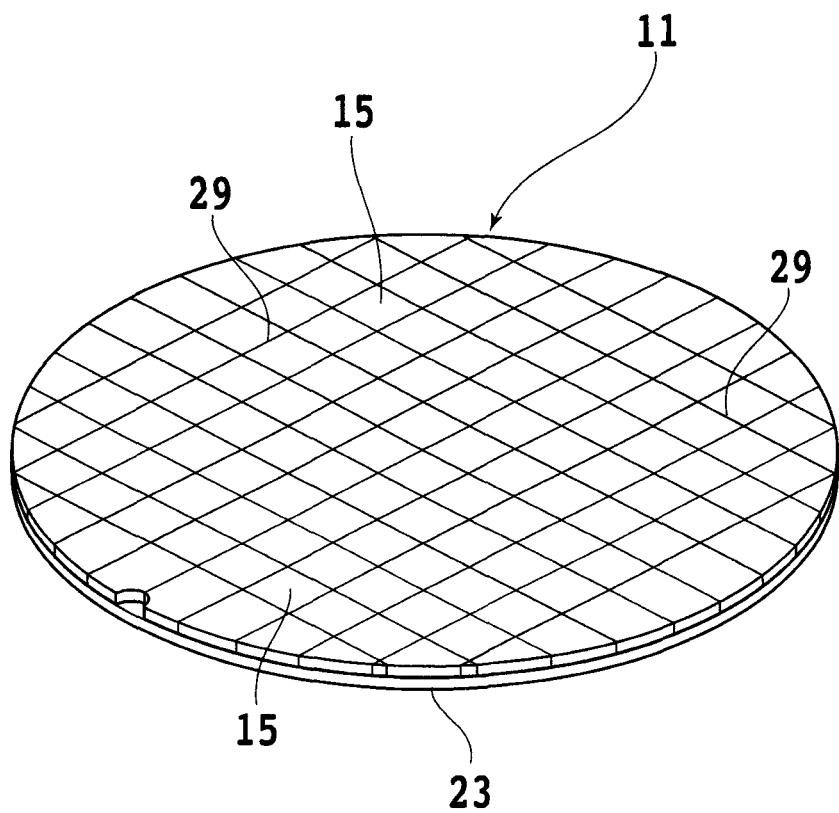
FIG. 6 is a perspective view of the semiconductor wafer in the condition where the wafer is divided into individual devices by a wafer dividing step.

After performing the modified layer forming step to form the modified layers 27 inside the wafer 11 along all of the division lines 13, a wafer dividing step is performed in such a manner that the wafer 11 is divided along the modified layers 27 into the individual devices 15 as shown in FIG. 6. In this wafer dividing step, an external force is applied to the wafer 11 to thereby break the wafer 11 along all of the division lines 13 so that the division of the wafer 11 is started from the modified layers 27, thereby forming a plurality of division grooves 29 along the division lines 13 as shown in FIG. 6. For example, this wafer dividing step may be performed by adopting a cutting method as disclosed in Japanese Patent No. 3408805 or by using a dividing jig as disclosed in Japanese Patent No. 4361506.

As shown in FIG. 6, the individual devices 15 obtained by dividing the wafer 11 remain attached to the protective tape 23 so as to maintain the form of the wafer 11. The width of each division groove 29 between the adjacent devices 15 is very small. Such a technique of forming a plurality of modified layers and dividing a wafer along the modified layers is referred to as stealth dicing.

Figure 7:
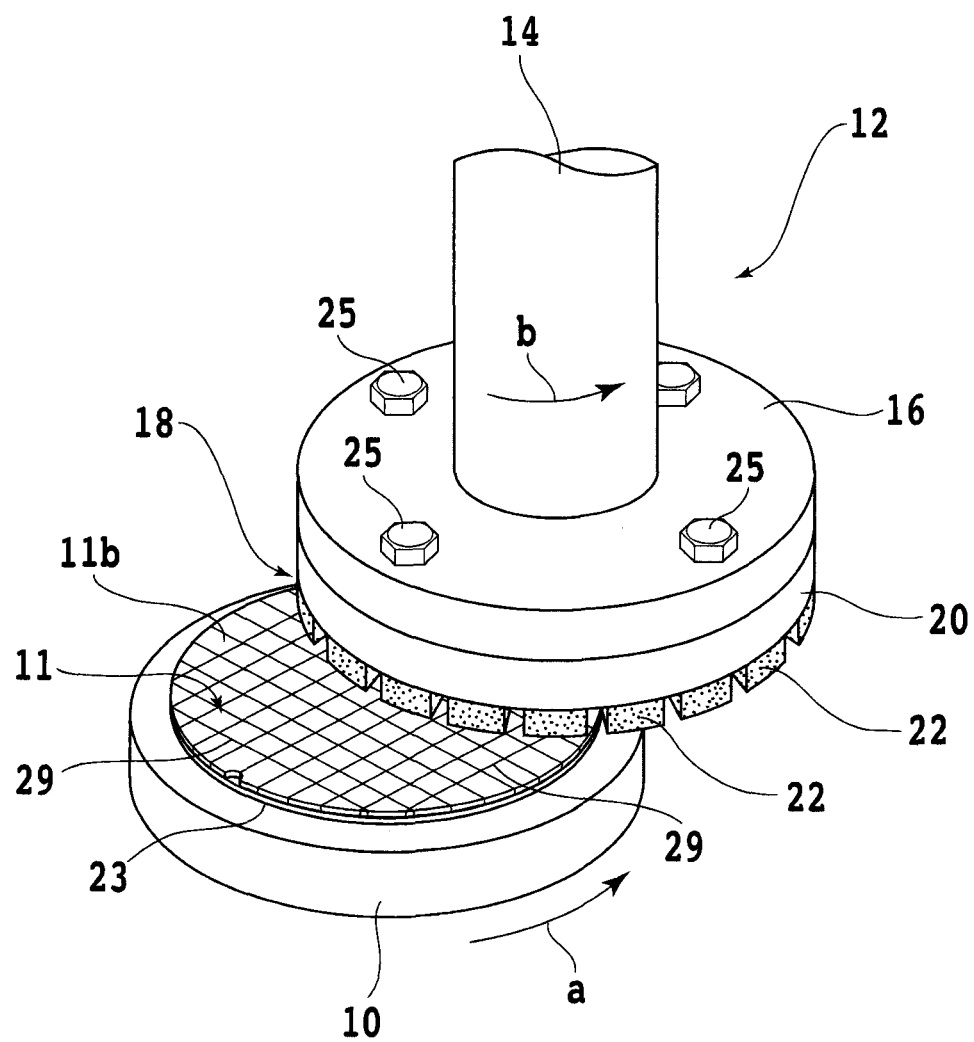
FIG. 7 is a perspective view showing a modified layer removing step.

After performing the wafer dividing step, a modified layer removing step is performed in such a manner that the back side 11b of the wafer 11 is ground to reduce the thickness of each device 15 to the finished thickness, thereby removing the modified layers 27 as shown in FIG. 7. This modified layer removing step is performed similarly to the back grinding step shown in FIG. 3. That is, as shown in FIG. 7, the wafer 11 processed by the wafer dividing step is held under suction on the chuck table 10 of the grinding apparatus in the condition where the protective tape 23 attached to the front side 11a of the wafer 11 is oriented downward, i.e., the back side 11b of the wafer 11 is oriented upward. The chuck table 10 is rotated in the direction shown by an arrow a in FIG. 7 at 300 rpm, for example, and the grinding wheel 18 is rotated in the same direction as the direction of rotation of the chuck table 10, i.e., in the direction shown by an arrow b in FIG. 7 at 6000 rpm, for example. Then, the grinding unit feeding mechanism is operated to bring the abrasive members 22 into contact with the back side 11b of the wafer 11.

The grinding wheel 18 is further fed downward by a predetermined amount at a predetermined feed speed (e.g., 3 to 5 μm/s) to thereby grind the back side 11b of the wafer 11. In grinding the back side 11b of the wafer 11, the contact type or noncontact type thickness gauge is used to measure the thickness of the wafer 11, thereby reaching the finished thickness (e.g., 20 μm) of the wafer 11, i.e., each device 15. Each modified layer 27 is formed at the depth of about 50 μm from the back side 11b of the wafer 11 in the back grinding step as mentioned above. Accordingly, each modified layer 27 can be completely removed by this modified layer removing step.

Figure 8:
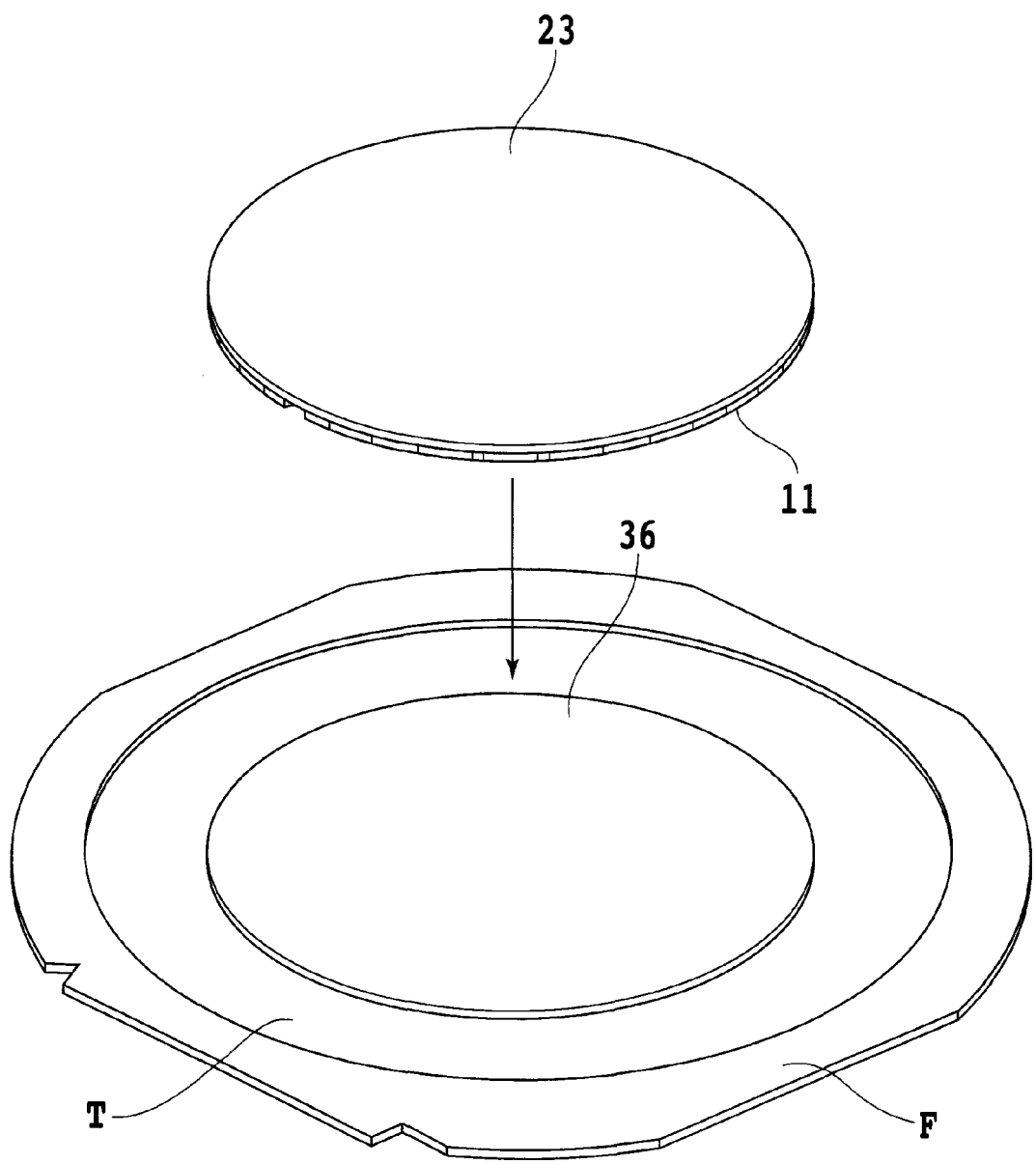
FIG. 8 is a perspective view showing a frame providing step.
Figure 9:
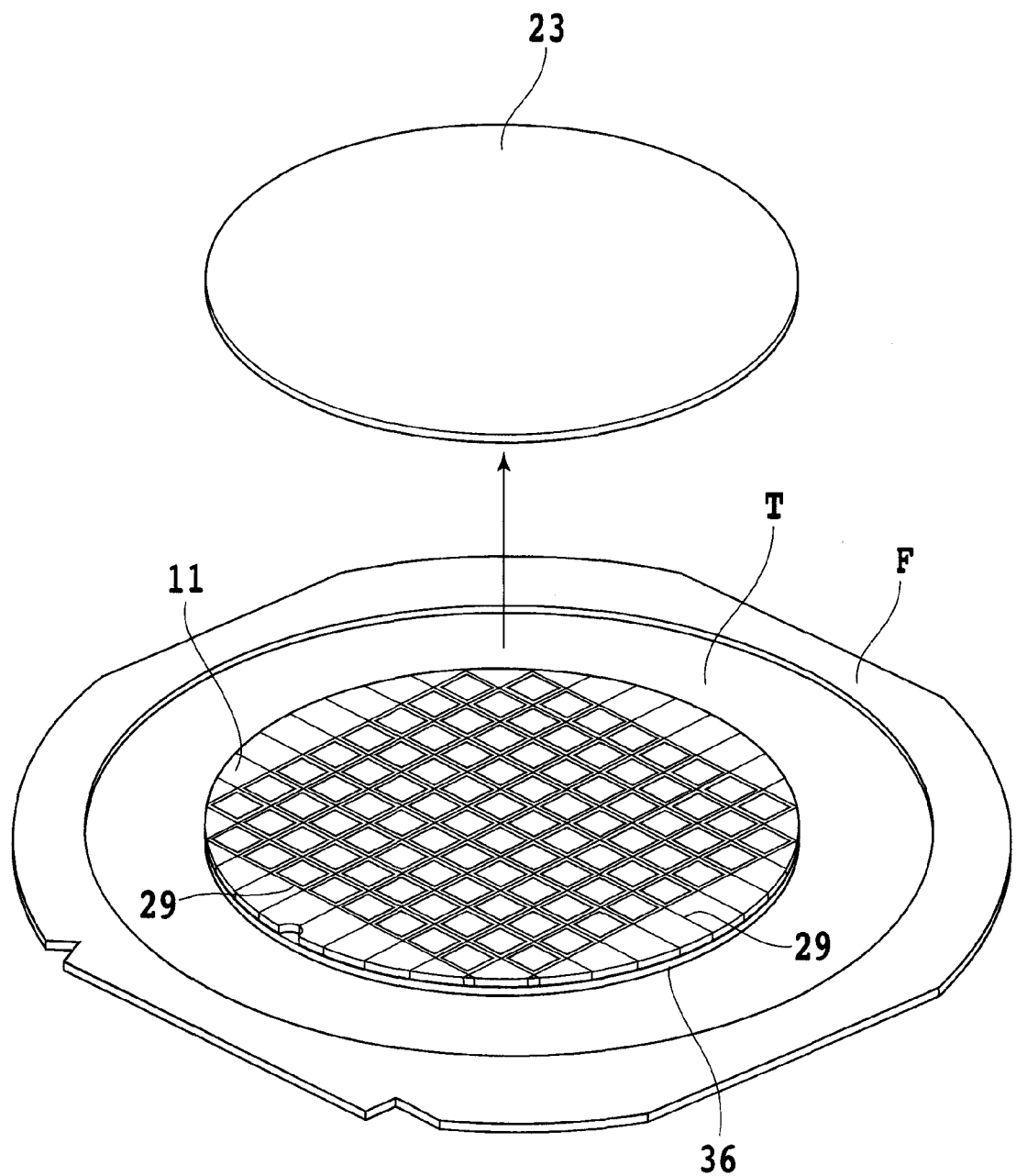
FIG. 9 is a perspective view showing a protective tape removing step.

After performing the modified layer removing step, a frame providing step is performed as shown in FIG. 8 in such a manner that an annular frame F having a circular opening is prepared, a dicing tape T is attached at its outer circumferential portion to the annular frame F so as to close the circular opening, a die attach film (DAF) 36 as a die bonding film is attached to the dicing tape T in the circular opening of the annular frame F, and the back side of the wafer 11 is attached to the DAF 36. By performing this frame providing step, the wafer 11 is supported through the DAF 36 and the dicing tape T to the annular frame F. Thereafter, the protective tape 23 is peeled off from the front side of the wafer 11 as shown in FIG. 9.

Figure 10A:
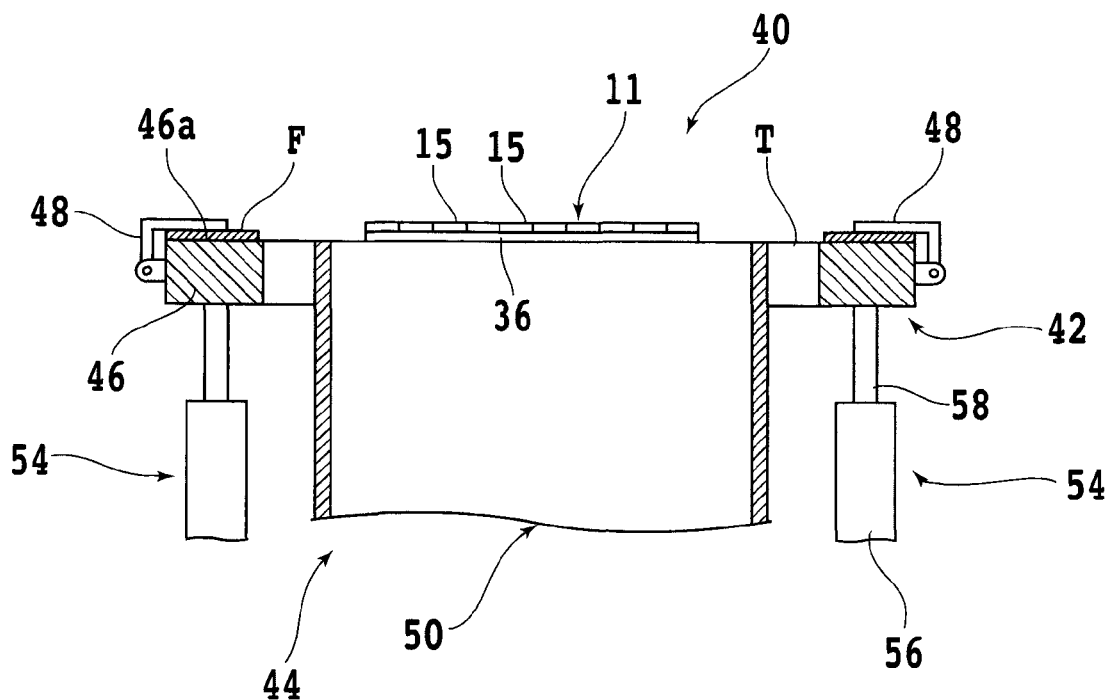
FIGS. 10A and 10B are vertical sectional views showing a die bonding film dividing step.

Thereafter, a die bonding film dividing step is performed in such a manner that the DAF 36 attached to the wafer 11 divided into the individual devices 15 is divided along the boundaries of the individual devices 15. This die bonding film dividing step is performed by using a dividing apparatus 40 shown in FIGS. 10A and 10B. As shown in FIG. 10A, the annular frame F supporting the wafer 11 divided into the individual devices 15 and the DAF 36 attached to the back side of the wafer 11 through the dicing tape T is mounted on a mounting surface 46a of a frame holding member 46 constituting frame holding means 42 and fixed to the frame holding member 46 by clamps 48. At this time, the frame holding member 46 is set at a reference position where the mounting surface 46a is substantially equal in height to the upper end of an expanding drum 50 of tape expanding means 44 as shown in FIG. 10A.

Figure 10B:
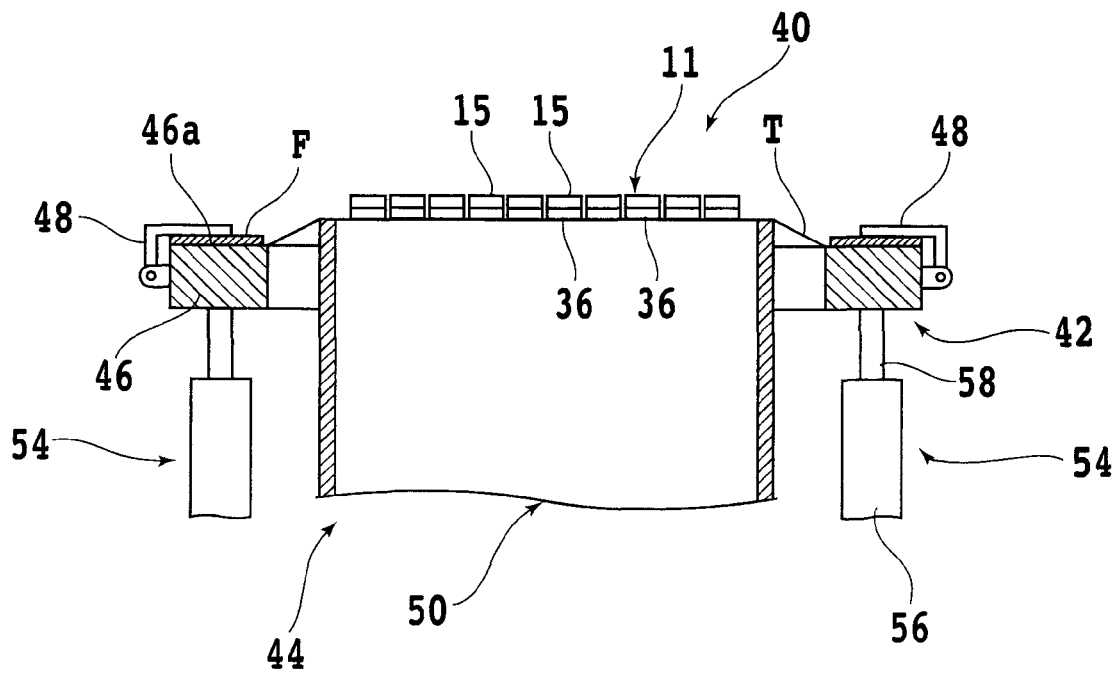
Figure 1:
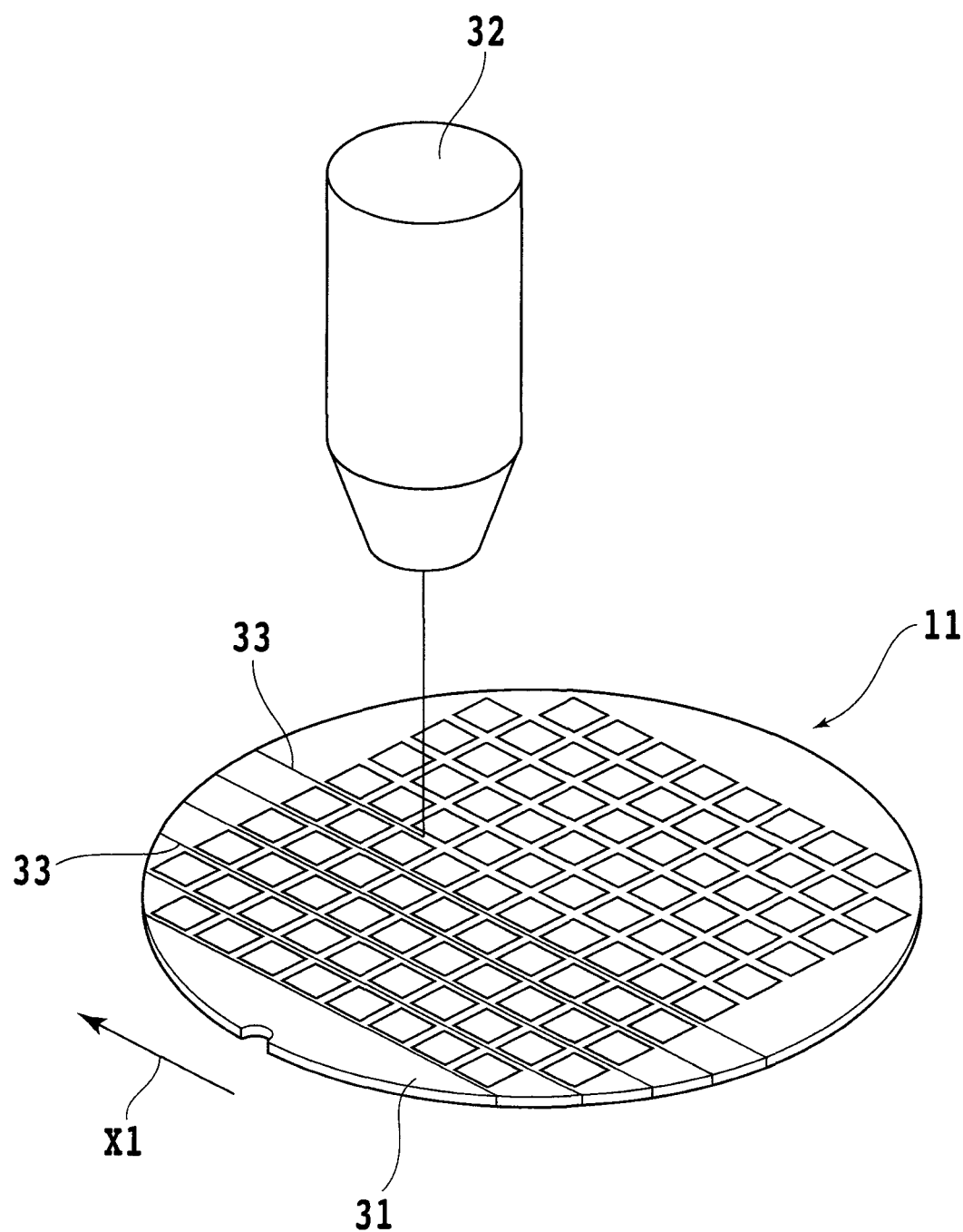

By driving air cylinders 56 constituting driving means 54, the frame holding member 46 is lowered by about 15 mm to an expansion position where the mounting surface 46a is lower in height than the upper end of the expanding drum 50 as shown in FIG. 10B. Accordingly, the annular frame F fixed to the mounting surface 46a of the frame holding member 46 is also lowered, so that the dicing tape T supported to the annular frame F comes into abutment against the upper end of the expanding drum 50 and is expanded mainly in the radial direction. As a result, a radial tensile force is applied to the DAF 36 attached to the dicing tape T. When such a radial tensile force is applied to the DAF 36, the DAF 36 is broken along the division lines 13 of the wafer 11, i.e., along the boundaries of the individual devices 15, thus obtaining the individual devices 15 each having the DAF 36 attached to the back side.

The width of each division groove 29 formed in the wafer 11 in the die bonding film dividing step is very small. That is, the spacing between any adjacent ones of the individual devices 15 is very small. Accordingly, the dicing tape T can be expanded uniformly in the radial direction, so that the DAF 36 can be easily divided along the boundaries of the individual devices 15.

As shown in FIG. 11, there is a case that an insulating film 31 such as a Low-k film or a resin film such as a polyimide film is formed on the front side of the wafer 11, depending on the kind of the wafer 11. Further, there is a case that a metal film such as a TEG is formed on the division lines 13 of the wafer 11. In such a case that a film is formed on at least the division lines 13 of the wafer 11 as mentioned above, a film cutting step of cutting the film is preferably performed before performing the back grinding step.

In this film cutting step, a laser beam for ablation is applied from focusing means 32 of a laser processing apparatus to the film 31 such as an insulating film along the division lines 13, thereby cutting the film 31 along the division lines 13 as shown in FIG. 11. In FIG. 11, the arrow X1 denotes a work feeding direction, and reference numerals 33 denote cut grooves.

For example, the film cutting step is performed under the following processing conditions.

Light source: LD pumped Q-switched Nd:YVO4 pulsed laser
    Wavelength: 355 nm (third harmonic generation of YVO4)
    Repetition frequency: 50 kHz
    Pulse width: 40 ns
    Average power: 1 W
    Focused spot diameter: 5 μm
    Work feed speed: 100 mm/s
    Incident surface: patterned surface (front side)

According to the preferred embodiment of the present invention described above, stealth dicing is performed to divide the wafer 11 into the individual devices 15. Thereafter, the back side 11b of the wafer 11 is ground to reduce the thickness of the wafer 11 to a finished thickness of each device 15, thereby removing the modified layers 27. Thereafter, the dicing tape T is attached through the DAF 36 to the back side 11b of the wafer 11. Thereafter, the dicing tape T is expanded by using a dividing apparatus to thereby break the DAF 36 along the boundaries of the individual devices 15. Accordingly, the DAF 36 can be easily divided along the boundaries of the individual devices 15 without a reduction in die strength of each device 15. Further, the thin devices 15 with the DAFs 36 can be provided.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method for dividing a wafer into a plurality of individual devices along a plurality of division lines formed on the front side of said wafer, wherein said devices are respectively formed in a plurality of regions partitioned by said division lines, said wafer dividing method comprising:

a protective member providing step of providing a protective member on the front side of said wafer;

a back grinding step of grinding the back side of said wafer to reduce the thickness of said wafer to a predetermined thickness;

a modified layer forming step of applying a laser beam having a transmission wavelength to said wafer from the back side of said wafer along said division lines in the condition where the focal point of said laser beam is set inside said wafer at a position corresponding to each division line, thereby forming a plurality of modified layers inside said wafer along said division lines at such a depth not reaching a finished thickness of each device;

a wafer dividing step of dividing said wafer along said modified layers into said individual devices;

a modified layer removing step of grinding the back side of said wafer divided into said individual devices to thereby remove said modified layers and reduce the thickness of each device to said finished thickness;

a frame providing step of preparing an annular frame having a circular opening, attaching a dicing tape at its outer circumferential portion to said annular frame so as to close said circular opening, attaching a die bonding film to said dicing tape in said circular opening of said annular frame, and attaching the back side of said wafer to said die bonding film;

a protective member removing step of removing said protective member from the front side of said wafer; and a die bonding film dividing step of expanding said dicing tape to increase the spacing between any adjacent ones of said individual devices, thereby dividing said die bonding film along the boundaries of said individual devices.

2. The wafer dividing method according to claim 1, wherein a film is formed on said division lines of said wafer, said wafer dividing method further comprising:

a film cutting step of applying a laser beam for ablation to said film along said division lines, thereby cutting said film along said division lines before performing said back grinding step.

3. The wafer dividing method according to claim 2, wherein said film includes any one of a metal film including a TEG, an insulating film including a Low-k film, and a resin film including a polyimide film.

* * * * *